United States Patent
Lin et al.

(10) Patent No.: US 9,970,718 B2
(45) Date of Patent: May 15, 2018

(54) MICROCHANNEL STRUCTURE AND HEAT SINK HAVING THE SAME

(71) Applicant: National Chung-Shan Institute of Science & Technology, Taoyuan (TW)

(72) Inventors: Cheng Lin, Hsinchu (TW); Jing-Hong Chen, Taoyuan (TW); Tsung-Yeh Liu, Taoyuan (TW)

(73) Assignee: National Chung-Shan Institute of Science & Technology (TW)

( * ) Notice: Subject to any disclaimer, the term of this patent is extended or adjusted under 35 U.S.C. 154(b) by 255 days.

(21) Appl. No.: 14/965,907

(22) Filed: Dec. 11, 2015

(65) Prior Publication Data

US 2017/0172012 A1 Jun. 15, 2017

(51) Int. Cl.
*F28F 13/08* (2006.01)
*F28F 9/02* (2006.01)
*H01L 23/473* (2006.01)
*F28D 21/00* (2006.01)

(52) U.S. Cl.
CPC .............. *F28F 13/08* (2013.01); *F28F 9/026* (2013.01); *H01L 23/473* (2013.01); *F28D 2021/0029* (2013.01); *F28F 2260/02* (2013.01)

(58) Field of Classification Search
CPC ........ F28F 13/08; F28F 9/026; F28F 2260/02; F28D 2021/0029; H01L 23/473
See application file for complete search history.

(56) References Cited

U.S. PATENT DOCUMENTS

2008/0279239 A1* 11/2008 Kan ...................... H01L 23/473
372/35

* cited by examiner

*Primary Examiner* — Armando Rodriguez

(57) ABSTRACT

The present invention mainly provides a novel microchannel structure comprising a plurality of first fluid-guiding channels, a plurality of micro fluid-guiding channels and a plurality of second fluid-guiding channels. Particularly, the first fluid-guiding channel has an arc-shaped fluid-guiding end corner communicating with a first channel opening of the micro fluid-guiding channel, and the second fluid-guiding channel has an arc-shaped fluid-guiding start corner communicating with a second channel opening of the micro fluid-guiding channel. Therefore, when a refrigerant fluid flows in the heat sink, the flow speed of the refrigerant fluid would be changed because the cross sectional area of an U-shaped fluid-guiding channel constructed by the arc-shaped fluid-guiding end corner, the micro fluid-guiding channel and the arc-shaped fluid-guiding start corner varies along the flow direction of the refrigerant fluid, such that the heat dissipating ability of the heat sink is enhanced without increasing the power of circulation pump.

17 Claims, 15 Drawing Sheets

MICROCHANNEL STRUCTURE AND HEAT SINK HAVING THE SAME

BACKGROUND OF THE INVENTION

1. Field of the Invention

The present invention relates to the technology field of heat sinks, and more particularly to a novel microchannel structure and a heat sink having the same.

2. Description of the Prior Art

With the semiconductor technologies being highly developed, the application of semiconductor laser devices, such as laser scalpel, laser soldering equipment, and laser pointer, being getting broader with the increase of their output power. Because the electro-optical conversion efficiency of the semiconductor laser device is about 30%~50%, there has about 50%~70% of electric energy being converting to heat under the operation of the semiconductor laser device; therefore, it is able to image that the performance and reliability of the semiconductor laser device would be largely reduced due to the heat accumulation excessively produced in the semiconductor laser device.

Accordingly, microchannel heat sink has proposed by Tuckerman and Pease in 1981, and is widely applied to various semiconductor laser devices for the heat dissipation purpose. Please refer to FIG. 1, which illustrates a framework view of a conventional semiconductor laser apparatus. As shown in FIG. 1, a plurality of semiconductor laser units 100' are stacked to form the conventional semiconductor laser apparatus 200', wherein each of the semiconductor laser units 100' consists of a semiconductor laser device array 2' and a heat sink 10' corresponding to the semiconductor laser device array 2'. Moreover, a cooling device 510' is connected to the heat sink 10' by a piping 600' for transmitting a refrigerant fluid into the heat sink 10' through the operation of a circulation pump 520', so as to enhance the heat-dissipating ability of the heat sink 10'.

Continuously referring to FIG. 1, and please simultaneously refer to FIG. 2, there is shown an exploded view of the heat sink 10'. As shown by FIG. 2, the heat sink 10' consists of: an inlet layer 20', a communication layer 30', and an outlet layer 40', wherein the inlet layer 20' is provided with a first opening 22' and a second opening 24' thereon. In addition, a first flow groove 26' with bell-shaped appearance is further formed on the inlet layer 20' and connected with the first opening 22'.

Inheriting to above descriptions, the communication layer 30' is provided with a third opening 32' opposite to the first opening 22' and a fourth opening 34' opposite to the second opening 24' thereon. Moreover, multiple micro fluid-guiding channels 36' are disposed on the communication layer 30'. On the other hand, the outlet layer 40' is provided with a fifth opening 42' opposite to the third opening 32' and a sixth opening 44' opposite to the fourth opening 34'. In addition, a second flow groove 46' with bell-shaped appearance is further formed on the outlet layer 40' and connected with the sixth opening 44'. In the heat sink 10', the first opening 22', the third opening 32' and the fifth opening 42' form an inlet port 160' for receiving the refrigerant fluid transmitted from the piping 600'. Opposite to the inlet port 160', the second opening 24', the fourth opening 34' and the sixth opening 44' form an outlet port 180' for transmitting the refrigerant fluid to the piping 600'.

Moreover, in the heat sink 10', because the diameter of the micro fluid-guiding channels 36' of the communication layer 30' is designed to about 1 μm~1000 μm, the refrigerant fluid would be accelerated to a jet current when the refrigerant fluid in the first flow groove 26' flows into the second flow groove 46' via the micro fluid-guiding channel 36', so as to enhance the heat dissipating ability of the heat sink 10'. However, despite that the heat sink 10' of FIG. 2 performs high heat dissipating ability, the inventors of the present invention find that the heat sink 10' still includes many drawbacks after practically applying the heat sink 10':

(1) Although the design of the micro fluid-guiding channels 36' facilitate the flow speed of the refrigerant fluid and the heat dissipating ability of the heat be largely enhanced, the power of the circulation pump 520' is simultaneously increased due to the high pressure difference inducted between two ends of the micro fluid-guiding channels 36'.

(2) Please refer to FIG. 3, which illustrates a cross-sectional view of the heat sink 10', wherein the section plane of the heat sink 10' shown in FIG. 3 is obtained by cutting the diagram of the heat sink 10' shown in FIG. 2 along the cutting plane line A'-A'. As shown in FIG. 3, since both the fluid-guiding corner 261' formed between the first flow groove 26' and the first channel opening 361' of the micro fluid-guiding channels 36' as well as the fluid-guiding corner 461' formed between the second flow groove 46' and the second channel opening 362' of the micro fluid-guiding channels 36' are a 90° corner, such 90° fluid-guiding corner would form a hindrance for causing the refrigerant fluid in the first flow groove 26' be unable to effectively flow into the micro fluid-guiding channels 36'. Moreover, after the heat sink 10' is used for a long term, it can find that the two 90° fluid-guiding corners are damaged by the high-speed scouring corrosion of the refrigerant fluid.

Accordingly, in view of the conventional micro fluid-guiding channels 36' and the heat sink 10' reveal many practically-used drawbacks, the inventor of the present application has made great efforts to make inventive research thereon and eventually provided a novel microchannel structure and a heat sink having the novel microchannel structure.

SUMMARY OF THE INVENTION

The primary objective of the present invention is to provide a novel microchannel structure and a heat sink having the novel microchannel structure, wherein the novel microchannel structure is applied in a heat sink consisting of an inlet layer, a communication layer and an outlet layer stacked to each other, and comprises a plurality of first fluid-guiding channels, a plurality of micro fluid-guiding channels and a plurality of second fluid-guiding channels. Particularly, the first fluid-guiding channel has an arc-shaped fluid-guiding end corner communicating with a first channel opening of the micro fluid-guiding channel, and the second fluid-guiding channel has an arc-shaped fluid-guiding start corner communicating with a second channel opening of the micro fluid-guiding channel. Therefore, when a refrigerant fluid flows in the heat sink, the flow speed of the refrigerant fluid would be changed because the cross sectional area of an U-shaped fluid-guiding channel constructed by the arc-shaped fluid-guiding end corner, the micro fluid-guiding channel and the arc-shaped fluid-guiding start corner varies along the flow direction of the refrigerant fluid, such that the heat dissipating ability of the heat sink is enhanced without increasing the power of circulation pump. Moreover, the U-shaped fluid-guiding channel also facilitates the refrigerant fluid flow in the heat sink more smoothly by reducing the production of the secondary fluid of the refrigerant fluid flow.

Accordingly, in order to achieve the primary objective of the present invention, the inventor of the present invention firstly provides a microchannel structure, which is applied in a heat sink comprising an inlet layer, a communication layer and an outlet layer stacked to each other; wherein the inlet layer and the outlet layer are provided with a first flow groove and a second flow groove thereon, respectively. Moreover, the said novel microchannel structure comprises a plurality of micro fluid-guiding channels disposed in the communication layer, wherein each of the micro fluid-guiding channels have a first channel opening and a second channel opening, and the diameter size of the first channel opening is not equal to the diameter size of the second channel opening. In addition, the first channel opening and the second channel opening are respectively connected to the first flow groove and the second flow groove, such that a refrigerant fluid in the first flow groove is able to flow into the second flow groove through the micro fluid-guiding channels.

In one embodiment of the novel microchannel structure, the micro fluid-guiding channel is an oval-shaped channel, and the diameter size of the first channel opening is greater or smaller than the diameter size of the second channel opening.

In another embodiment of the novel microchannel structure, the micro fluid-guiding channel comprises a cylinder channel and a conical channel, and the diameter size of the first channel opening is greater or smaller than the diameter size of the second channel opening.

In all embodiments of the novel microchannel structure, further comprising a plurality of first fluid-guiding protrusions and a plurality of first fluid-guiding channels formed in the first flow groove, wherein each the first fluid-guiding channel is surrounded by two first fluid-guiding protrusions and has a fluid-guiding end corner with arc-shaped appearance, and the fluid-guiding end corner communicating with the first channel opening. Moreover, the all embodiments of the novel microchannel structure further comprises a plurality of second fluid-guiding protrusions and a plurality of second fluid-guiding channels formed in the second flow groove, wherein each the second fluid-guiding channel is surrounded by two fluid-guiding protrusions and has a fluid-guiding start corner with arc-shaped appearance, and the fluid-guiding start corner communicating with the second channel opening.

Furthermore, in all embodiments of the novel microchannel structure, the first fluid-guiding channel has a first fluid-guiding depth and the second fluid-guiding channel has a second fluid-guiding depth, wherein the first fluid-guiding depth isg greater or smaller than the second fluid-guiding depth.

Besides, in order to achieve the primary objective of the present invention, the inventor of the present invention further provides a heat sink having the novel microchannel structure, comprises:
a communication layer, having a plurality of micro fluid-guiding channels;
an inlet layer, connected to one surface of the communication layer, and provided with a first through hole, a second through hole, and a first flow groove communicating with the first through hole; and
an outlet layer, connected to the other surface of the communication layer opposite to the inlet layer, and provided with a second flow groove thereon; wherein the second flow groove is simultaneously corresponding to the second through hole of the inlet layer and the micro fluid-guiding channels of the communication layer;

wherein each of the micro fluid-guiding channels have a first channel opening communicating with the first flow groove and a second channel opening communicating with the second flow groove; moreover, the diameter size of the first channel opening is not equal to the diameter size of the second channel opening;

wherein after a refrigerant fluid is inputted into the first flow groove through the first through hole, the refrigerant fluid would continuously flow into the second flow groove via the micro fluid-guiding channels; and eventually, the refrigerant fluid flowing out of the novel heat sink via the second through hole.

In one embodiment of the heat sink, the micro fluid-guiding channel is an oval-shaped channel, and the diameter size of the first channel opening is greater or smaller than the diameter size of the second channel opening.

In another embodiment of the heat sink, the micro fluid-guiding channel comprises a cylinder channel and a conical channel, and the diameter size of the first channel opening is greater or smaller than the diameter size of the second channel opening.

In all embodiments of the heat sink, further comprising a plurality of first fluid-guiding protrusions and a plurality of first fluid-guiding channels formed in the first flow groove, wherein each the first fluid-guiding channel is surrounded by two first fluid-guiding protrusions and has a fluid-guiding end corner with arc-shaped appearance, and the fluid-guiding end corner communicating with the first channel opening. Moreover, the all embodiments of the novel microchannel structure further comprises a plurality of second fluid-guiding protrusions and a plurality of second fluid-guiding channels formed in the second flow groove, wherein each the second fluid-guiding channel is surrounded by two fluid-guiding protrusions and has a fluid-guiding start corner with arc-shaped appearance, and the fluid-guiding start corner communicates with the second channel opening.

Furthermore, in all embodiments of the heat sink, the first fluid-guiding channel has a first fluid-guiding depth and the second fluid-guiding channel has a second fluid-guiding depth, wherein the first fluid-guiding depth is greater or smaller than the second fluid-guiding depth.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a novel microchannel structure and a heat sink having the novel microchannel structure according to the present invention, embodiments of the present invention will be described in detail with reference to the attached drawings hereinafter.

Figure 4:
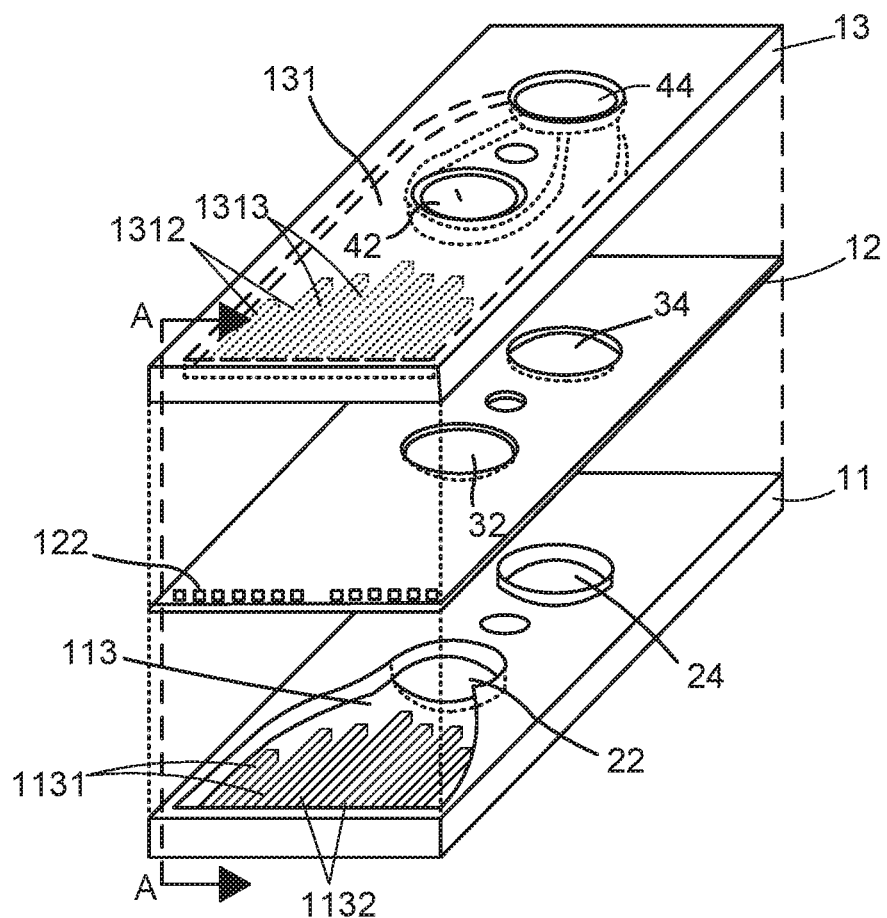
FIG. 4 shows an exploded view of a heat sink integrated with a novel microchannel structure according to the present invention.
Figure 5:
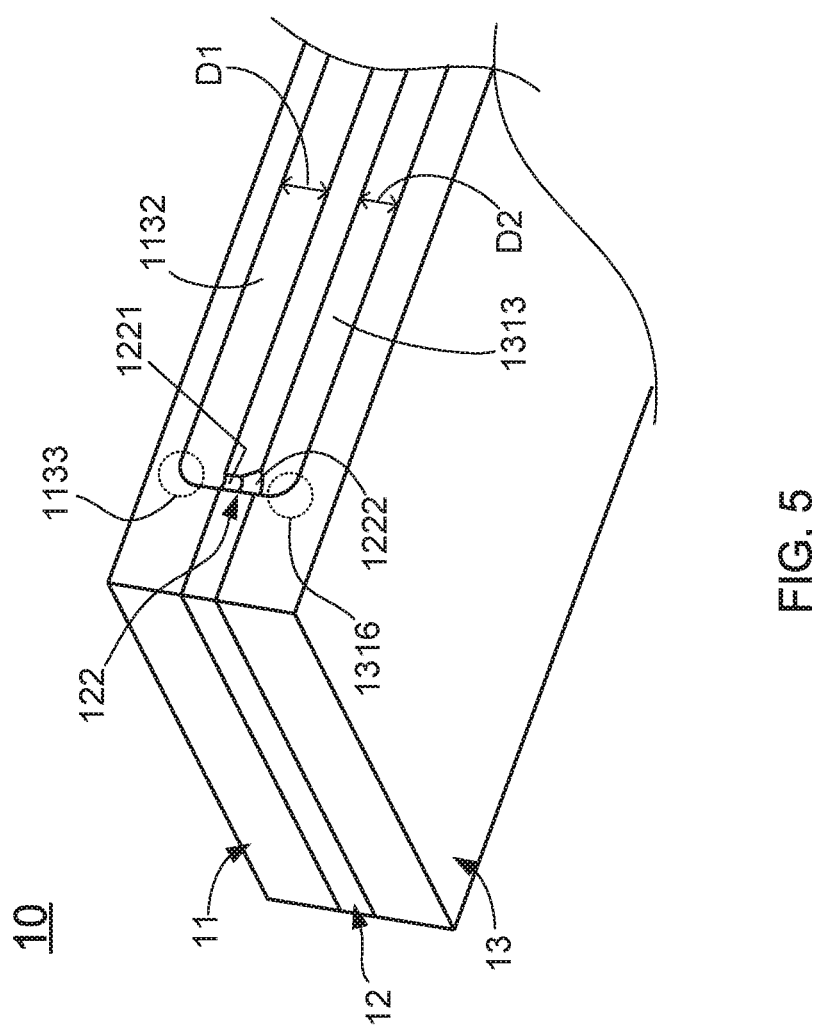
FIG. 5 shows a cross-sectional view of the heat sink.

With reference to FIG. 4, where an exploded view of a heat sink integrated with a novel microchannel structure according to the present invention is provided. Moreover, please simultaneously refer to FIG. 5, which illustrates a cross-sectional view of the heat sink 10, wherein the section plane of the heat sink 10 shown in FIG. 5 is obtained by cutting the diagram of the heat sink 10 shown in FIG. 4 along the cutting plane line A-A. Moreover, it's worth noting that the heat sink 10 shown by FIG. 4 is a combination of the heat sink 10' shown in FIG. 2 and the novel microchannel structure proposed by the present invention.

As FIG. 4 and FIG. 5 show, the heat sink 10 consists of an inlet layer 11, a communication layer 12 and an outlet layer 13 stacked to each other. In the heat sink 10, the inlet layer is provided with a first opening 22 and a second opening 24 thereon, and a first flow groove 113 with bell-shaped appearance is further formed on the inlet layer 11 and connected with the first opening 22. Opposite to the inlet layer 11, the communication layer 12 is provided with a third opening 32 corresponding to the first opening 22 and a fourth opening 34 corresponding to the second opening 24 thereon. On the other hand, opposite to the communication layer 12, the outlet layer 13 is provided with a fifth opening 42 corresponding to the third opening 32 and a six opening 44 corresponding to the fourth opening 34. Moreover a second flow groove 131 with bell-shaped appearance is further formed on the outlet layer 13 and connected with the sixth opening 44.

First Embodiment

The novel microchannel structure mainly comprises a plurality of micro fluid-guiding channels 122 disposed in the communication layer 12, wherein each of the micro fluid-guiding channels 122 have a first channel opening 1221 communicating with the first flow groove 113 and a second channel opening 1222 communicating with the second flow groove 131. By such arrangement, the refrigerant fluid in the first flow groove 113 is able to further flow into the second flow groove 131 through the micro fluid-guiding channels 122. Moreover, as FIG. 5 shows, the micro fluid-guiding channel 122 comprises a cylinder channel and a conical channel, and the diameter size of the channel opening (i.e., first channel opening 1221) of the cylinder channel is greater or smaller than the diameter size of the channel opening (i.e., second channel opening 1222) of the conical channel.

Moreover, the novel microchannel structure also comprises a plurality of first fluid-guiding protrusions 1131 and a plurality of first fluid-guiding channels 1132 formed in the first flow groove 113; wherein each the first fluid-guiding channel 1132 is surrounded by two first fluid-guiding protrusions 1131 and has a fluid-guiding end corner 1133 with arc-shaped appearance, and the fluid-guiding end corner 1133 communicates with the first channel opening 1221. In addition, the novel microchannel structure further comprises a plurality of second fluid-guiding protrusions 1312 and a plurality of second fluid-guiding channels 1313 formed in the second flow groove 131; wherein each the second fluid-guiding channel 1313 is surrounded by two fluid-guiding protrusions 1312 and has a fluid-guiding start corner 1316 with arc-shaped appearance, and the fluid-guiding start corner 1316 communicates with the second channel opening 1222. Particularly, as FIG. 5 shows, the first fluid-guiding channel 1132 has a first fluid-guiding depth D1 and the second fluid-guiding channel 1313 has a second fluid-guiding depth D2, and the first fluid-guiding depth D1 is greater or smaller than the second fluid-guiding depth D2.

As shown in FIG. 4 and FIG. 5, when a specific refrigerant fluid comprised of fluorocarbon flows in the heat sink 10, the flow speed of the refrigerant fluid would be changed because the cross sectional area of an U-shaped fluid-guiding channel constructed by the arc-shaped fluid-guiding end corner 1133, the micro fluid-guiding channel 122 and the arc-shaped fluid-guiding start corner 1316 varies along the flow direction of the refrigerant fluid, such that the heat dissipating ability of the heat sink 10 is then effectively enhanced without increasing the power of circulation pump. Except for that, the U-shaped fluid-guiding channel constructed by the arc-shaped fluid-guiding end corner 1133, the micro fluid-guiding channel 122 and the arc-shaped fluid-guiding start corner 1316 can also facilitate the refrigerant fluid flow in the heat sink 10 more smoothly by reducing the production of the secondary fluid of the refrigerant fluid flow.

Theoretical Basis

It is well known that the fluid flow can be calculated by the mathematical formula of Q=ρAV, wherein "Q" means capacity of the fluid flow, "ρ" means density of the fluid, "A" means cross sectional area of the flow channel, and "V" means flow speed of the fluid. From FIG. 5, it can find that the U-shaped fluid-guiding channel constructed by the arc-shaped fluid-guiding end corner 1133, the micro fluid-guiding channel 122 and the arc-shaped fluid-guiding start corner 1316 varies along the flow direction of the refrigerant fluid, so that the flow speed of the refrigerant fluid would change with the variation of the cross sectional area of the flow channel under identical capacity of the refrigerant fluid flow. Moreover, the engineers skilled in designing microchannel structure well knew that the pressure difference between two channel openings of one micro fluid-guiding channel 122 can be calculated by the mathematical formula of $$\Delta P = \frac{2fL\rho V^2}{D_h},$$

wherein "f" means friction coefficient of the micro fluid-guiding channel 122, "L" means channel length of the micro fluid-guiding channel 122, and $D_h$ means channel hydraulic diameter of the micro fluid-guiding channel 122. Thus, based on the mathematical formula of ΔP, it is able to effectively reduce the pressure difference between the two channel openings of the micro fluid-guiding channels 122 by way of making the fluid-guiding depth D1 be smaller than the second fluid-guiding depth D2, so as to alleviate the power consumption of circulation pump.

Second Embodiment

Figure 6:
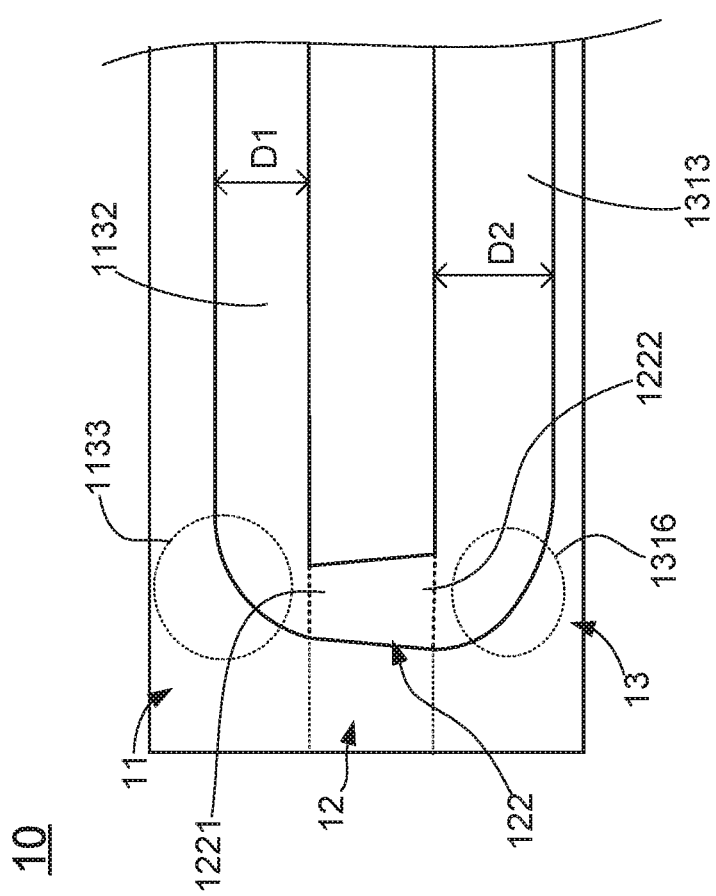
FIG. 6 shows a cross-sectional view of the heat sink.

Referring to FIG. 4 again, and please simultaneously refer to FIG. 6, which illustrates a cross-sectional view of the heat sink 10. The section plane of the heat sink 10 shown in FIG. 6 is obtained by cutting the diagram of the heat sink 10 shown in FIG. 4 along the cutting plane line A-A. However, differing from the section plane of the heat sink 10 shown in FIG. 5, the micro fluid-guiding channel 122 shown in FIG. 6 is an oval-shaped channel, and the diameter size of the first channel opening 1221 is greater or smaller than the diameter size of the second channel opening 1222. Thus, after the second embodiment of the micro fluid-guiding channels 122 are implemented on the communication layer 12, the arc-shaped fluid-guiding end corner 1133, the micro fluid-guiding channel 122 and the arc-shaped fluid-guiding start corner 1316 also form an U-shaped fluid-guiding channel between the inlet layer 11, the communication layer 12 and the outlet layer 13. Similarly, the cross sectional area of the said U-shaped fluid-guiding varies along the flow direction of the refrigerant fluid, such that the heat dissipating ability of the heat sink 10 is then effectively enhanced without increasing the power of circulation pump.

Figure 1:
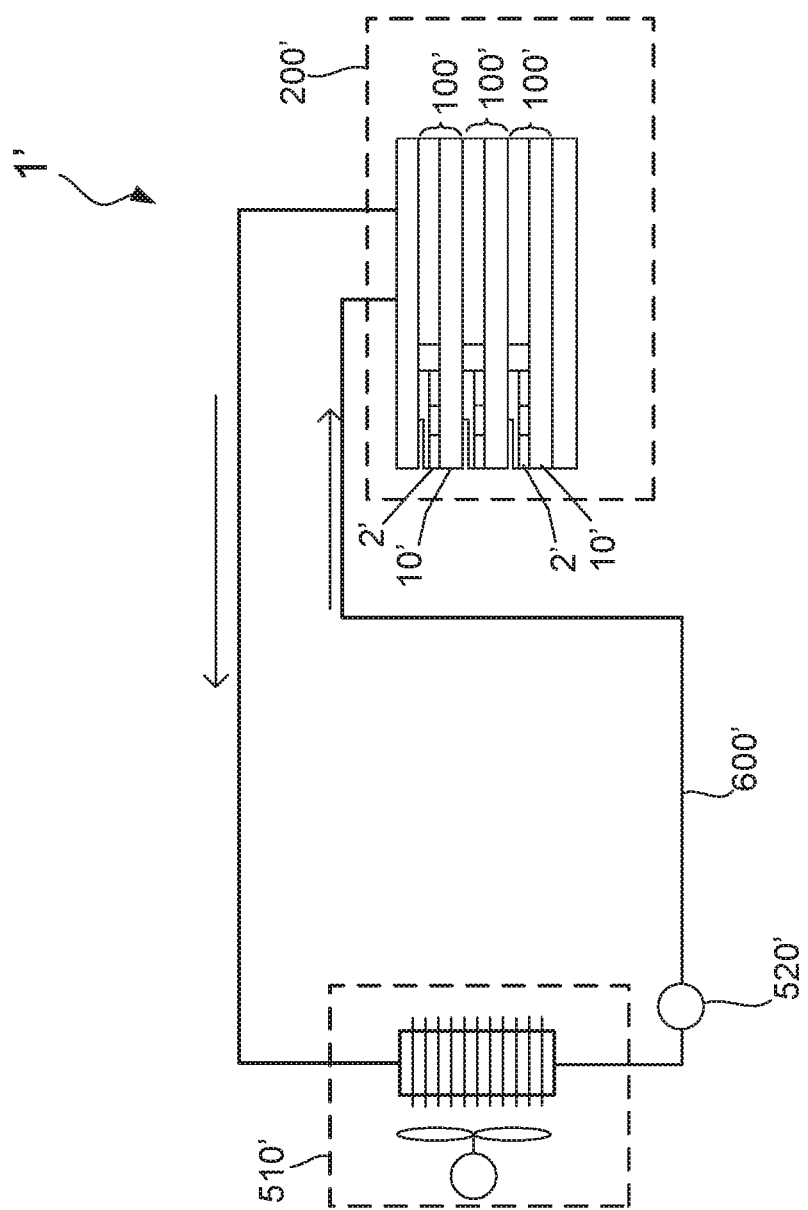
FIG. 1 shows a framework view of a conventional semiconductor laser apparatus.
Figure 2:
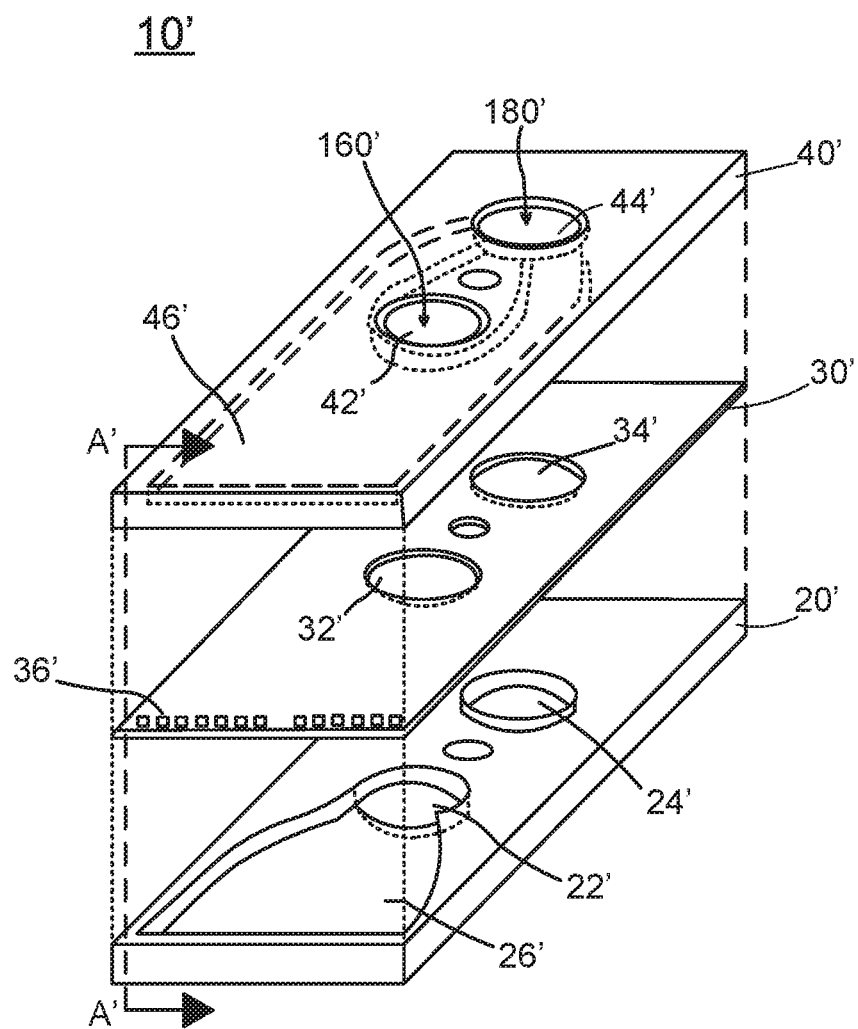
FIG. 2 shows an exploded view of a conventional heat sink.

Herein, it needs to further explain that, to fabricate the conventional heat sink 10' shown by FIG. 2, it firstly respectively provided the micro fluid-guiding channels 36', the first flow groove 26' and the second flow groove 46' on three DB (Diffusion Bonding) substrates though precision wire cutting process or etching process. Then, the three DB substrates (i.e., the inlet layer 20', the communication layer 30' and the outlet layer 40') are installed and welded to form the heat sink 10'. However, the heat sink 10' has a primary drawback of weak structure strength due to the limitation of processing precision and welding adaptation. So that, after the heat sink 10' is used for a long term, it can find that the inner fluid-guiding channels are damaged by the high-speed scouring corrosion of the refrigerant fluid.

Differing from the conventional heat sink 10' of FIG. 2, in the present invention, the micro fluid-guiding channels 122, the first fluid-guiding protrusions 1131, the second fluid-guiding protrusions 1312, the fluid-guiding end corner 1133 of the first fluid-guiding channel 1132, and the fluid-guiding start corner 1316 of the second fluid-guiding channel 1313 are processed through a ultrasonic milling tool having miniature grinding ball or by way of 3D printing. So that, the heat sink 10 having the novel microchannel structure provided by the present invention has a high-strength construction. Except for that, the U-shaped fluid-guiding channel constructed by the arc-shaped fluid-guiding end corner 1133, the micro fluid-guiding channel 122 and the arc-shaped fluid-guiding start corner 1316 can also facilitate the refrigerant fluid flow in the heat sink 10 more smoothly by reducing the production of the secondary fluid of the refrigerant fluid flow. Therefore, even if the heat sink 10 has been used for a long term, it can find that the inner fluid-guiding channels are prevented from the damage caused by the high-speed scouring corrosion of the refrigerant fluid.

Figure 7:
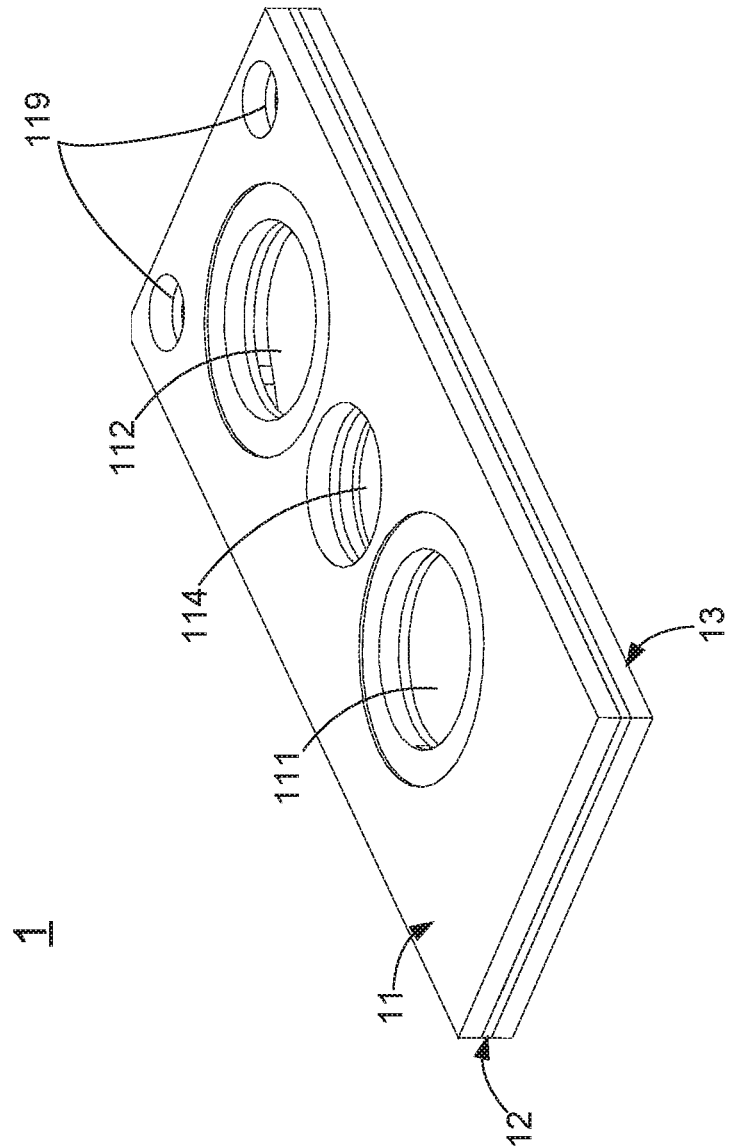
FIG. 7 shows a stereo view obtained from one view angle of a novel heat sink according to the present invention.
Figure 8:
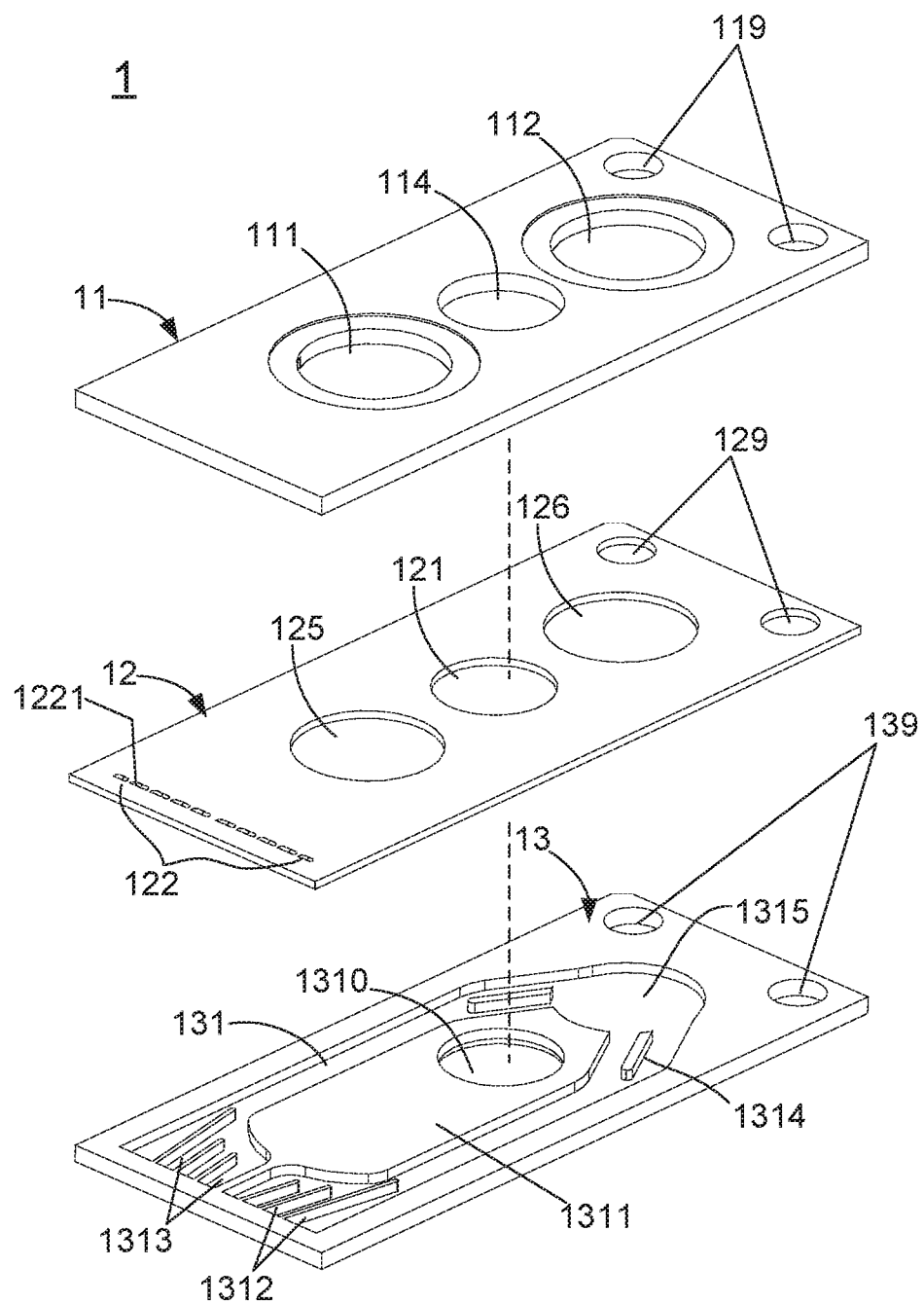
FIG. 8 shows an exploded view obtained from one view angle of the novel heat sink.
Figure 9:
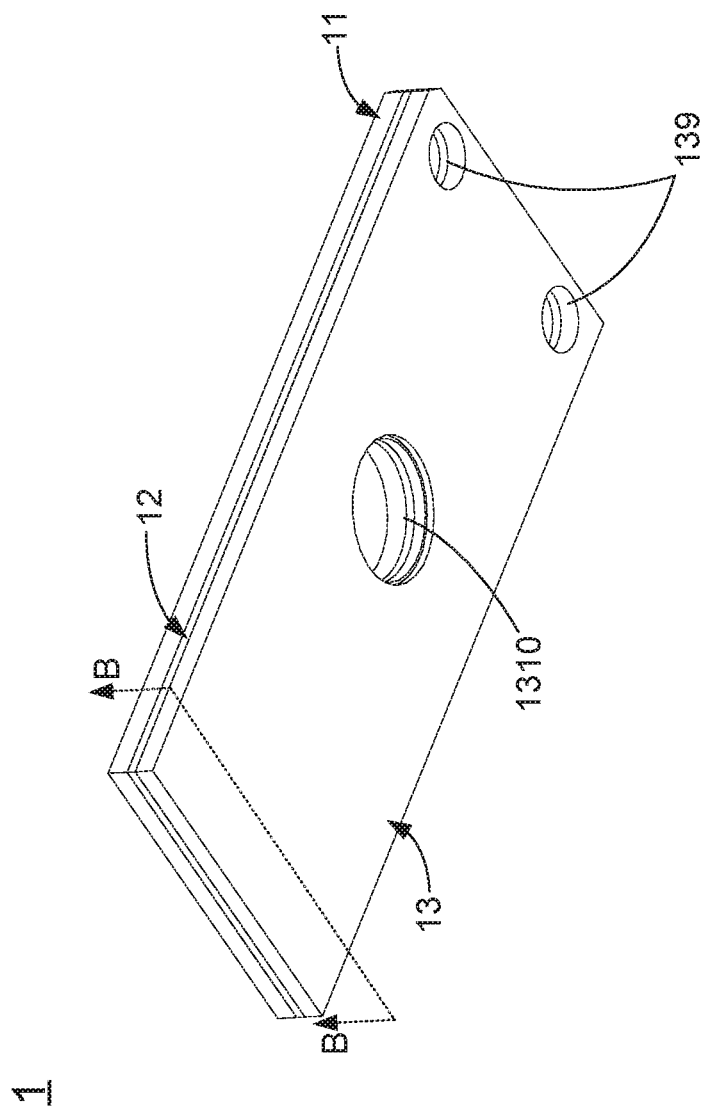
FIG. 9 shows a stereo view obtained from another one view angle of the novel heat sink.
Figure 10:
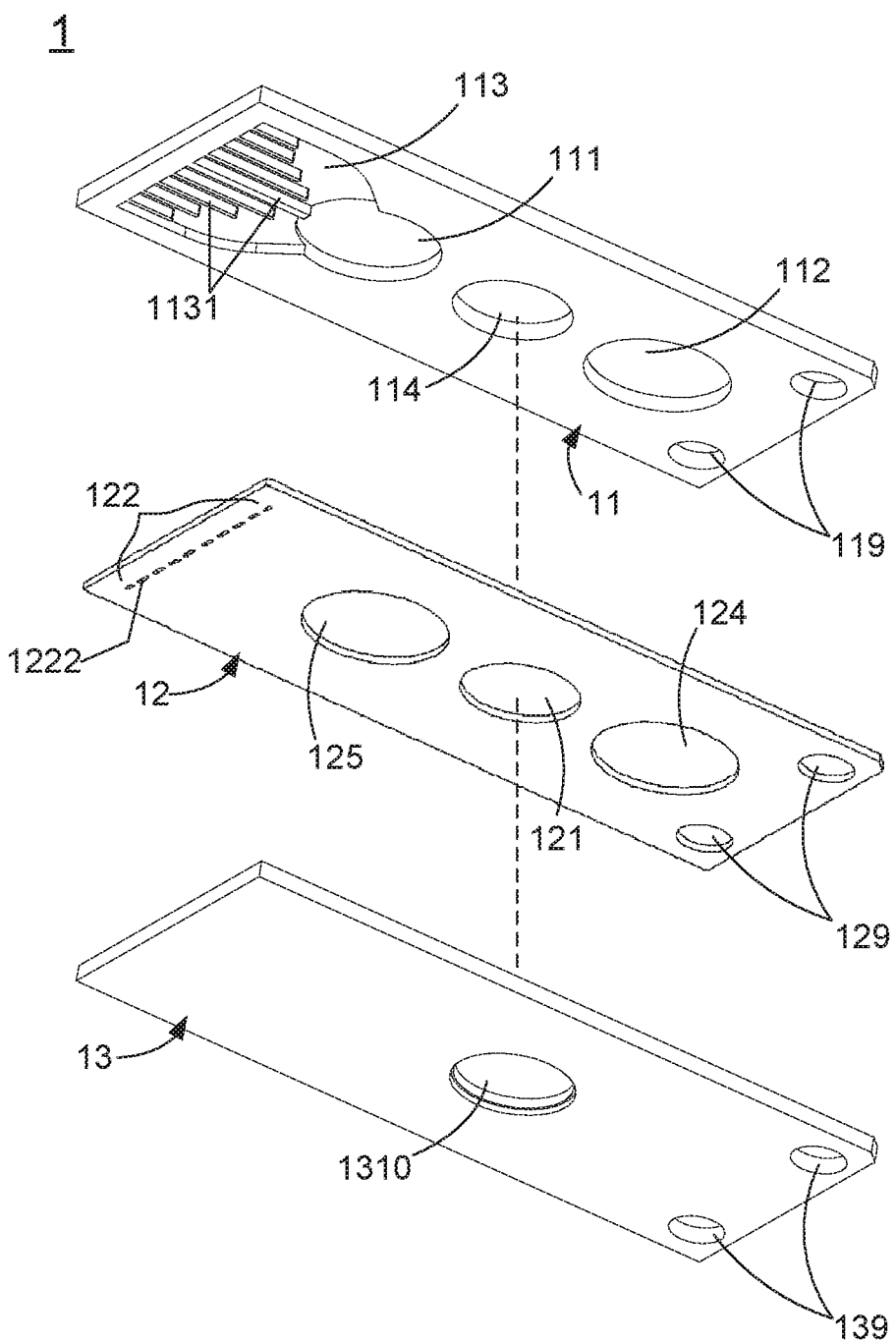
FIG. 10 shows an exploded view obtained from another one view angle of the novel heat sink.

Continuously, a heat sink (hereinafter "heat sink") integrated with aforesaid novel microchannel structure according to the present invention will be introduced in following paragraphs. With reference to FIG. 7 and FIG. 8, where a stereo view and an exploded view obtained from one view angle of the novel heat sink are provided. Moreover, please simultaneously refer to FIG. 9 and FIG. 10, there are shown a stereo view and an exploded view obtained from another one view angle of the novel heat sink. As shown in FIGS. 7-10, the novel heat sink 1 consists of an inlet layer 11, a communication layer 12 and an outlet layer 13 stacked to each other. The communication layer 12 mainly has a plurality of micro fluid-guiding channels 122, and is provided with a third through hole 125 and a fourth through hole 126 thereon. Moreover, the inlet layer 11 is connected to one surface of the communication layer 12, and provided with a first through hole 111 corresponding to the third through hole 125, a second through hole 112 corresponding to the fourth through hole 126, and a first flow groove 113 communicating with the first through hole 111. Furthermore, the outlet layer 13 is connected to the other surface of the communication layer 12 opposite to the inlet layer 11, and provided with a second flow groove 131 thereon; wherein the second flow groove 131 is simultaneously corresponding to the third through hole 125, the fourth through hole 126, and the micro fluid-guiding channels 122.

Figure 11:
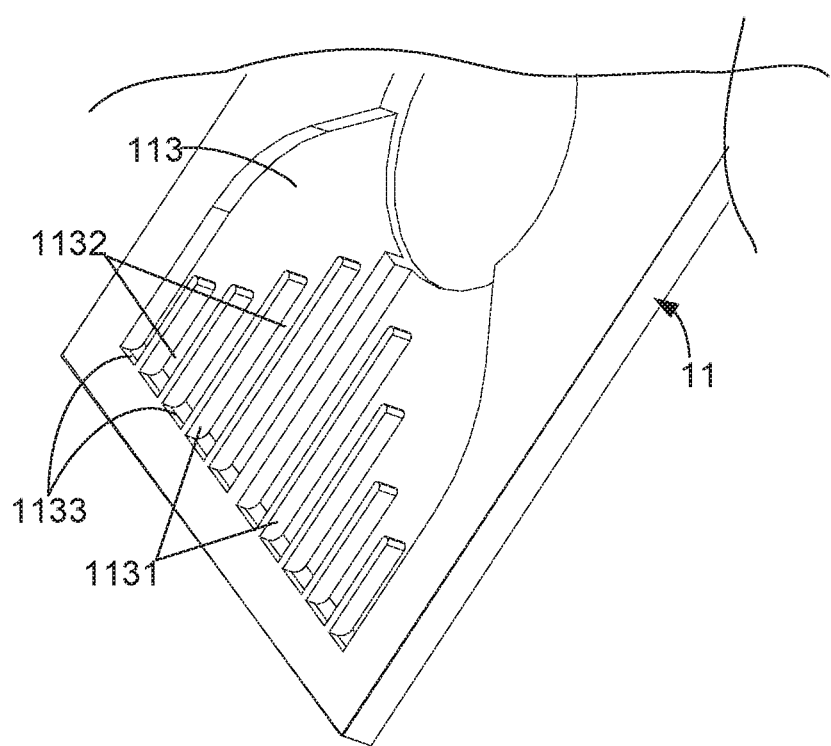
FIG. 11 shows a partial enlarged view of a first flow groove.
Figure 12:
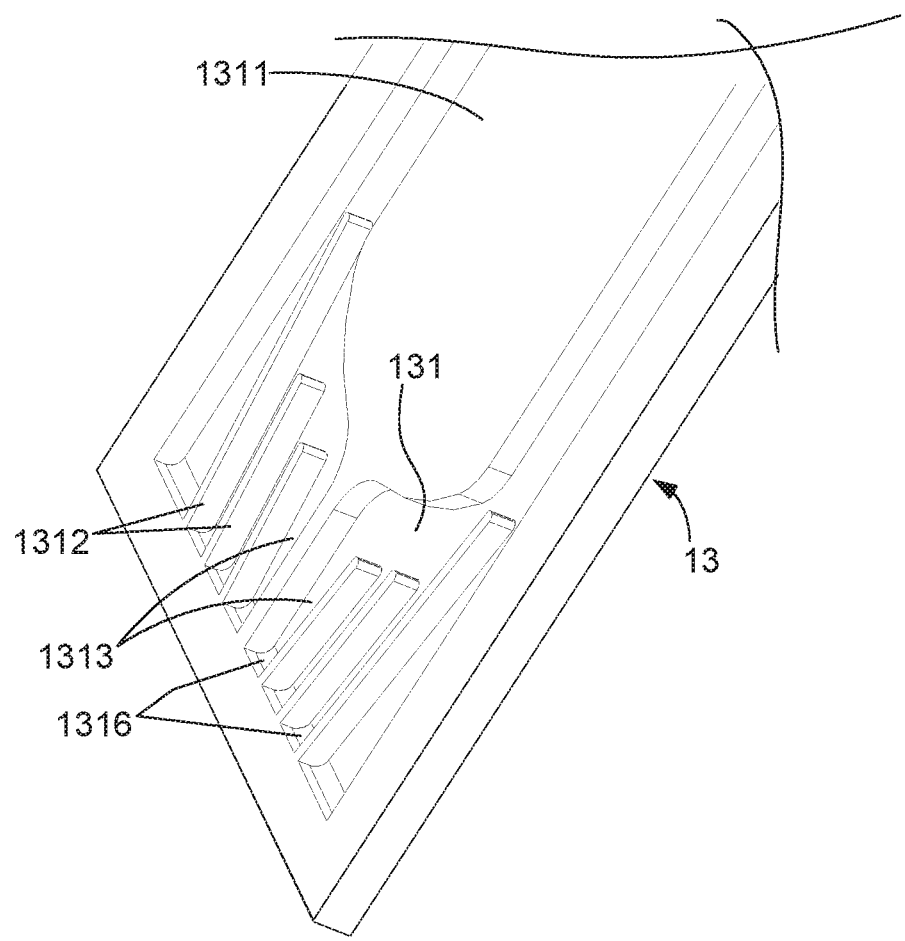
FIG. 12 shows a partial enlarged view of a second flow groove.
Figure 13:
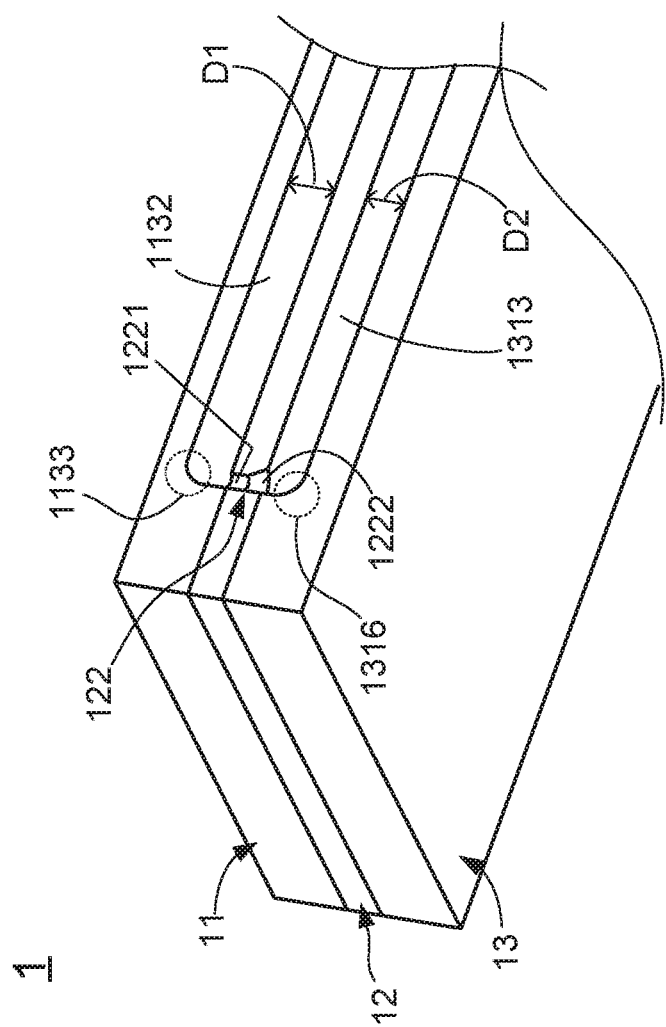
FIG. 13 shows a cross-sectional view of the novel heat sink.

Please simultaneously refer to FIG. 11 and FIG. 12, there are shown partial enlarged views of the first flow groove 113 and the second flow groove 131. Moreover, please simultaneously refer to FIG. 13, which illustrates a cross-sectional view of the novel heat sink 1, wherein the section plane of the novel heat sink 1 shown in FIG. 13 is obtained by cutting the diagram of the novel heat sink 1 shown in FIG. 9 along the cutting plane line B-B. In the structure of the novel heat sink 1, the micro fluid-guiding channel 122 comprises a cylinder channel and a conical channel, and the diameter size of the first channel opening 1221 is greater or smaller than the diameter size of the second channel opening 1222. Moreover, a plurality of first fluid-guiding protrusions 1131 and a plurality of first fluid-guiding channels 1132 formed in the first flow groove 113, wherein each the first fluid-guiding channel 1132 surrounded by two first fluid-guiding protrusions 1131 and has a fluid-guiding end corner 1133 with arc-shaped appearance, and the fluid-guiding end corner 1133 communicates with the first channel opening 1221. Herein, it is worth to further explain that, the first fluid-guiding protrusions 1131 comprises a center fluid-guiding protrusion having the largest length; moreover, by taking the center fluid-guiding protrusion as a symmetrical center, the lengths of other first fluid-guiding protrusions are getting reduced symmetrically along the direction toward the two side walls of the first flow groove 113.

Differing from the first flow groove 113, the second flow groove 131 of the outlet layer 13 are formed with a center distribution protrusion 1311, a plurality of second fluid-guiding channels 1313, two distribution protrusions 1314, and a through hole communicating region 1315. As FIG. 8 and FIG. 12 show, the second fluid-guiding channels 1313 formed in the second flow groove 131 are opposite to a first end of the center distribution protrusion 1311; wherein each the second fluid-guiding channel 1313 surrounded by two fluid-guiding protrusions 1312 and has a fluid-guiding start corner 1316 with arc-shaped appearance, and the fluid-guiding start corner 1316 communicates with the second channel opening 1222. Moreover, it is worth to further explain that, the second fluid-guiding protrusions 1312 comprises a center fluid-guiding protrusion having the largest length; moreover, by taking the center fluid-guiding protrusion as a symmetrical center, the lengths of other second fluid-guiding protrusions 1312 are getting increased symmetrically along the direction toward the two side walls of the second flow groove 131. In addition, the two distribution protrusions 1314 formed in the second flow groove 131 and adjacent to a second end of the center distribution protrusion 1311. Moreover, the through hole communicating region 1315 locating in the second flow groove 131 is opposite to the second end of the center distribution protrusion 1311.

Therefore, by such structure arrangement for the inlet layer 11, the communication layer 12 and the outlet layer 13, after a refrigerant fluid is inputted into the novel heat sink 1 through the first through hole 111, the refrigerant fluid would continuously flow in the first fluid-guiding channels 1132 of the first flow groove 113. Then, the refrigerant fluid would flow into the second flow groove 131 of the outlet layer 13 via the micro fluid-guiding channels 122 of the communication layer 12, and continuously flow in the second fluid-guiding channels 1313 of the second flow groove 131. Meanwhile, the refrigerant fluid flowing along the second fluid-guiding channels 1313 would be divided by the center distribution protrusion 1311, so as to continuously flow in the second flow groove 131 along the two lateral sides of the center distribution protrusion 1311. Eventually, the refrigerant fluid flows and converges to the through hole communicating region 1315, so as to flow out of the novel heat sink 1 via the fourth through hole 126 of the communication layer 12 and the second through hole 112 of the inlet layer 11.

Figure 3:
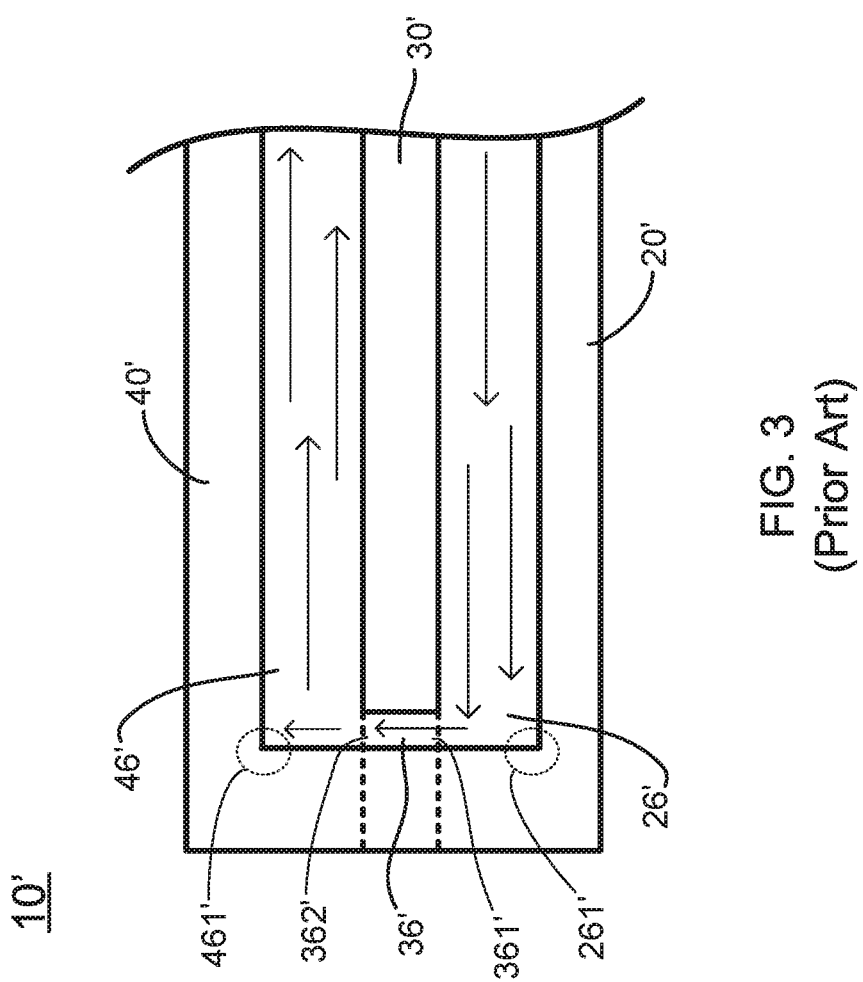
FIG. 3 shows a cross-sectional view of the heat sink.

Particularly, as FIG. 3 shows, the first fluid-guiding channel 1132 has a first fluid-guiding depth D1 and the second fluid-guiding channel 1313 has a second fluid-guiding depth D2, and the first fluid-guiding depth D1 is greater or smaller than the second fluid-guiding depth D2. By such arrangement for the fluid-guiding depth, the flow speed of the refrigerant fluid would be changed because the cross sectional area of an U-shaped fluid-guiding channel constructed by the arc-shaped fluid-guiding end corner 1133, the micro fluid-guiding channel 122 and the arc-shaped fluid-guiding start corner 1316 varies along the flow direction of the refrigerant fluid, such that the heat dissipating ability of the heat sink 10 is then effectively enhanced without increasing the power of circulation pump. Except for that, the U-shaped fluid-guiding channel constructed by the arc-shaped fluid-guiding end corner 1133, the micro fluid-guiding channel 122 and the arc-shaped fluid-guiding start corner 1316 can also facilitate the refrigerant fluid flow in the heat sink 10 more smoothly by reducing the production of the secondary fluid of the refrigerant fluid flow.

Figure 14:
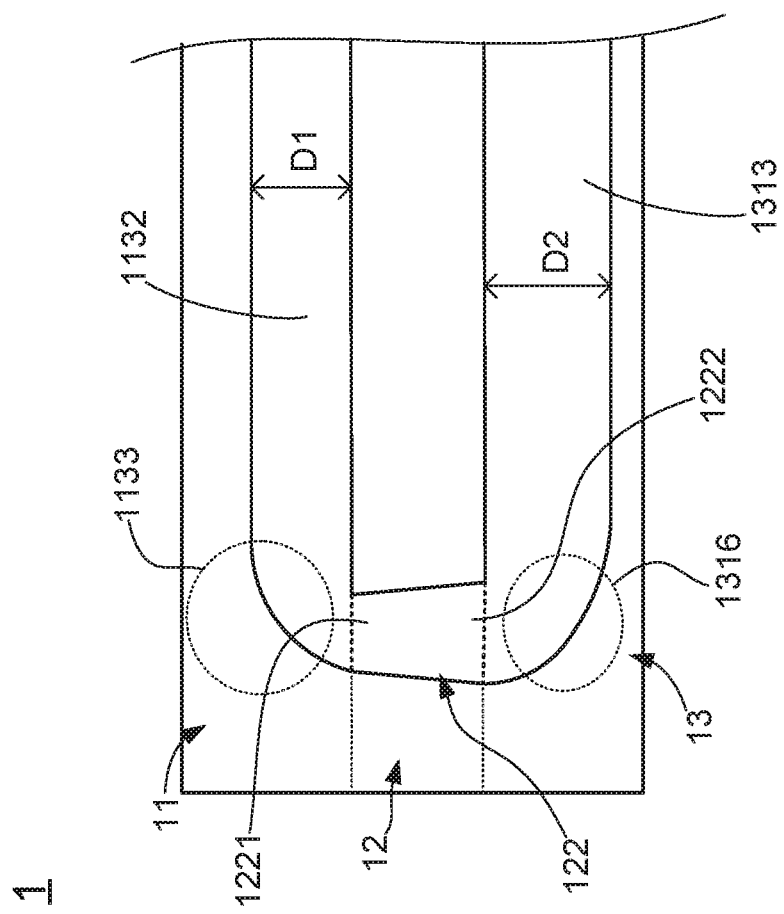
FIG. 14 shows a cross-sectional view of the novel heat sink.

Referring to FIG. 9 again, and please simultaneously refer to FIG. 14, where a cross-sectional view of the novel heat sink 1 is provided. The section plane of the novel heat sink 1 shown in FIG. 14 is obtained by cutting the diagram of the novel heat sink 1 shown in FIG. 9 along the cutting plane line B-B. However, differing from the section plane of the novel heat sink 10 shown in FIG. 13, the micro fluid-guiding channel 122 shown in FIG. 14 is an oval-shaped channel, and the diameter size of the first channel opening 1221 is greater or smaller than the diameter size of the second channel opening 1222. Thus, after the second embodiment of the micro fluid-guiding channels 122 are implemented on the communication layer 12, the arc-shaped fluid-guiding end corner 1133, the micro fluid-guiding channel 122 and the arc-shaped fluid-guiding start corner 1316 also form an U-shaped fluid-guiding channel between the inlet layer 11, the communication layer 12 and the outlet layer 13. Similarly, the cross sectional area of the said U-shaped fluid-guiding channel varies along the flow direction of the refrigerant fluid, such that the heat dissipating ability of the heat sink 10 is then effectively enhanced without increasing the power of circulation pump.

It needs to further explain that, the communication layer 12, the inlet layer 11 and the center distribution protrusion 1311 of the outlet layer 13 are respectively formed with a first screw hole 121, a second screw hole 114 and a third screw hole 1310 corresponding to the first screw hole 114 and the second screw hole 121. Therefore, after assembling the inlet layer 11, the communication layer 12 and the outlet layer 13 to the novel heat sink 1, screw elements can be embedded into these second screw holes for enhance the welding adaptation of the novel heat sink 1. Moreover, as FIGS. 7-10 show, the communication layer 12, the inlet layer 11 and the outlet layer 13 are further formed with at least one first auxiliary hole 119, at least one second auxiliary hole 129 and at least one third auxiliary hole 139, respectively. Thus, when this novel heat sink 1 is combined to a specific device, such as an LED device, a laser diode device, an IC chip, a parallel-plate waveguide, a 3D IC chip, a fuel cell, or a biochip, it can insert a pin or a bolt into the three auxiliary holes for fixing the novel heat sink 1 on the specific device.

Figure 15:
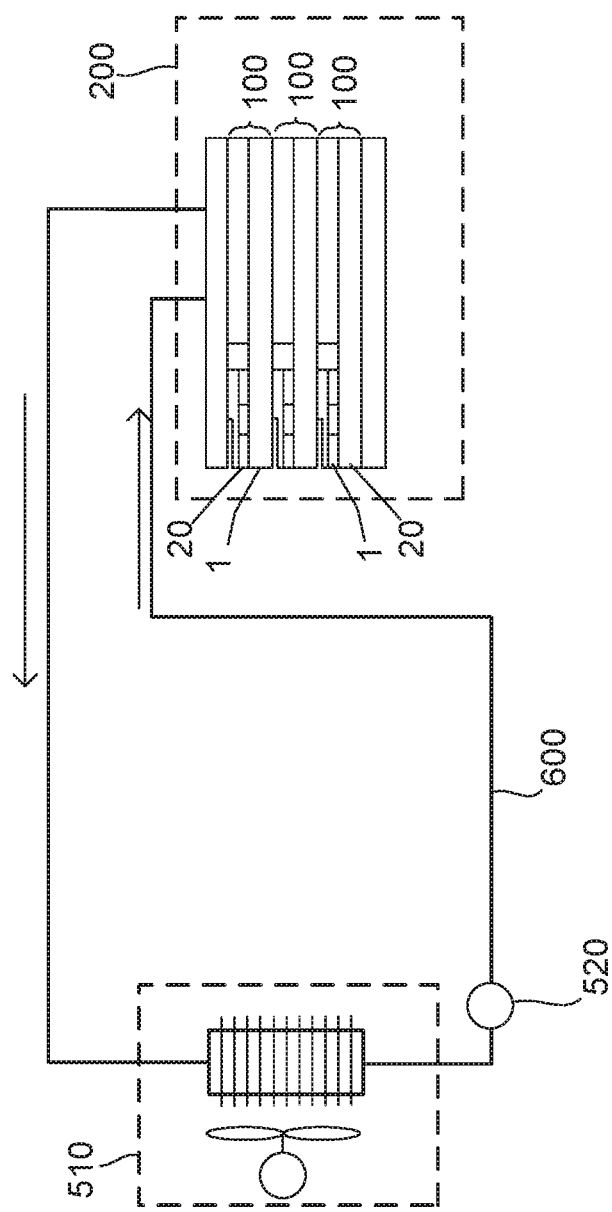
FIG. 15 shows a framework diagram of a semiconductor laser apparatus.

For instance, in the framework diagram of a semiconductor laser apparatus shown in FIG. 15, a plurality of semiconductor laser units 100 are stacked to form the conventional semiconductor laser apparatus 200, wherein each of the semiconductor laser units 100 consists of a semiconductor laser device array 20 and a novel heat sink 1 corresponding to the semiconductor laser device array 20. That is, the semiconductor laser units 100 are stacked by multiple novel heat sinks 1 and multiple semiconductor laser device arrays 20. Moreover, a cooling device 510 is connected to the novel heat sink 1 by a piping 600 for transmitting a refrigerant fluid into the novel heat sink 1 through the operation of a circulation pump 520, so as to enhance the heat-dissipating ability of the novel heat sink 10.

The above description is made on embodiments of the present invention. However, the embodiments are not intended to limit scope of the present invention, and all equivalent implementations or alterations within the spirit of the present invention still fall within the scope of the present invention.

What is claimed is:

1. A novel microchannel structure, being applied in a heat sink comprising an inlet layer, a communication layer and an outlet layer stacked to each other; wherein the inlet layer and the outlet layer are provided with a first flow groove and a second flow groove thereon, respectively;

wherein the said novel microchannel structure comprises a plurality of micro fluid-guiding channels disposed in the communication layer; moreover, each of the plurality micro fluid-guiding channel having a first channel opening and a second channel opening, and the diameter size of the first channel opening being not equal to the diameter size of the second channel opening;

wherein the first channel opening and the second channel opening are respectively connected to the first flow groove and the second flow groove, such that a refrigerant fluid in the first flow groove is able to flow into the second flow groove through each of the plurality micro fluid-guiding channel;

wherein a plurality of first fluid-guiding protrusions and a plurality of first fluid-guiding channels are formed in the first flow groove, and each of the plurality first fluid-guiding channel is surrounded by two first fluid-guiding protrusions and has a fluid-guiding end corner with arc-shaped appearance for communicating with the first channel opening.

2. The novel microchannel structure of claim 1, wherein each of the plurality micro fluid-guiding channel is an oval-shaped channel, and the diameter size of the first channel opening being greater or smaller than the diameter size of the second channel opening.

3. The novel microchannel structure of claim 1, wherein each of the plurality micro fluid-guiding channel comprises a cylinder channel and a conical channel, and the diameter size of the first channel opening being greater or smaller than the diameter size of the second channel opening.

4. The novel microchannel structure of claim 1, further comprising a plurality of second fluid-guiding protrusions and a plurality of second fluid-guiding channels formed in the second flow groove, wherein each of the plurality second fluid-guiding channel is surrounded by two fluid-guiding protrusions and has a fluid-guiding start corner with arc-shaped appearance, and the fluid-guiding start corner communicating with the second channel opening.

5. The novel microchannel structure of claim 4, wherein each of the plurality first fluid-guiding channel has a first fluid-guiding depth, and each of the plurality second fluid-guiding channel having a second fluid-guiding depth; moreover, the first fluid-guiding depth being greater or smaller than the second fluid-guiding depth.

6. The novel microchannel structure of claim 4, wherein each of the plurality micro fluid-guiding channels, each of the plurality first fluid-guiding protrusions, each of the plurality second fluid-guiding protrusions, the fluid-guiding end corner of each of the plurality first fluid-guiding channel, and the fluid-guiding start corner of each of the plurality second fluid-guiding channel are processed through a ultrasonic milling tool having miniature grinding ball or by way of 3D printing.

7. The novel heat sink, comprising:
   a communication layer, having a plurality of micro fluid-guiding channels;
   an inlet layer, being connected to one surface of the communication layer, and provided with a first through hole, a second through hole, and a first flow groove communicating with the first through hole; and
   an outlet layer, being connected to the other surface of the communication layer opposite to the inlet layer, and provided with a second flow groove thereon;
   wherein the second flow groove is simultaneously corresponding to the second through hole of the inlet layer and each of the plurality micro fluid-guiding channel of the communication layer;
   wherein each of the plurality micro fluid-guiding channel has a first channel opening communicating with the first flow groove and a second channel opening communicating with the second flow groove; moreover, the diameter size of the first channel opening being not equal to the diameter size of the second channel opening;
   wherein a plurality of first fluid-guiding protrusions and a plurality of first fluid-guiding channels are formed in the first flow groove, and each of the plurality first fluid-guiding channel being surrounded by two first fluid-guiding protrusions and having a fluid-guiding end corner with arc-shaped appearance; moreover, the fluid-guiding end corner communicating with the first channel opening;
   wherein after a refrigerant fluid is inputted into the first flow groove through the first through hole, the refrigerant fluid would continuously flow into the second flow groove via each of the plurality micro fluid-guiding channel; and eventually, the refrigerant fluid flowing out of the novel heat sink via the second through hole.

8. The novel heat sink of claim 7, wherein the communication layer is further provided with a first screw hole, a third through hole corresponding to the first through hole, and a fourth through hole corresponding to the second through hole.

9. The novel heat sink of claim 7, wherein each of the plurality micro fluid-guiding channel is one oval-shaped channel, and the diameter size of the first channel opening being greater or smaller than the diameter size of the second channel opening.

10. The novel heat sink of claim 7, wherein each of the plurality micro fluid-guiding channel comprises a cylinder channel and a conical channel, and the diameter size of the first channel opening being greater or smaller than the diameter size of the second channel opening.

11. The novel heat sink of claim 7, wherein the inlet layer is further provided with a second screw hole corresponding to the first screw hole.

12. The novel heat sink of claim 7, wherein each of the plurality first fluid-guiding protrusions comprises a center fluid-guiding protrusion having the largest length; moreover, by taking the center fluid-guiding protrusion as a symmetrical center, the lengths of other first fluid-guiding protrusions being getting reduced symmetrically along the direction toward the two side walls of the first flow groove.

13. The novel heat sink of claim 11, wherein the outlet layer further comprises:
   a center distribution protrusion, being formed on the center of the second flow groove;
   a plurality of second fluid-guiding channels, being formed in the second flow groove and opposite to a first end of the center distribution protrusion; wherein each of the plurality second fluid-guiding channel is surrounded by two fluid-guiding protrusions and has a fluid-guiding start corner with arc-shaped appearance, and the fluid-guiding start corner communicating with the second channel opening;
   two distribution protrusions, being formed in the second flow groove and adjacent to a second end of the center distribution protrusion;
   a through hole communicating region, locating in the second flow groove and opposite to the second end of the center distribution protrusion;
   wherein after the refrigerant fluid flows into the second flow groove, the refrigerant fluid would continuously flow along each of the plurality second fluid-guiding channel and divided by the center distribution protrusion; moreover, the refrigerant fluid divided by the center distribution protrusion would continuously flow in the second flow groove along the two lateral sides of the center distribution protrusion; and eventually, the refrigerant fluid flowing and converging to the through hole communicating region, so as to flow out of the novel heat sink via the second through hole.

14. The novel heat sink of claim 13, wherein the center fluid-guiding protrusion is formed with a third screw hole corresponding to the first screw hole and the second screw hole.

15. The novel heat sink of claim 13, wherein each of the plurality second fluid-guiding protrusion comprises a center fluid-guiding protrusion having the largest length, moreover, by taking the center fluid-guiding protrusion as a symmetrical center, the lengths of other second fluid-guiding protrusions being getting increased symmetrically along the direction toward the two side walls of the second flow groove.

16. The heat sink of claim 13, wherein each of the plurality first fluid-guiding channel has a first fluid-guiding depth and the second fluid-guiding channel has a second fluid-guiding depth, and the first fluid-guiding depth being greater or smaller than the second fluid-guiding depth.

17. The novel heat sink of claim 13, wherein each of the plurality micro fluid-guiding channels, each of the plurality first fluid-guiding protrusions, each of the plurality second fluid-guiding protrusions, the fluid-guiding end corner of each of the plurality first fluid-guiding channel, and the fluid-guiding start corner of each of the plurality second fluid-guiding channel are processed through a ultrasonic milling tool having miniature grinding ball or by way of 3D printing.

* * * * *